(12) United States Patent
Kuwazawa

(10) Patent No.: US 7,132,706 B2
(45) Date of Patent: Nov. 7, 2006

(54) SOLID-STATE IMAGING DEVICE

(75) Inventor: Kazunobu Kuwazawa, Suwa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 10/997,141

(22) Filed: Nov. 24, 2004

(65) Prior Publication Data

US 2005/0110061 A1 May 26, 2005

(30) Foreign Application Priority Data

Nov. 26, 2003 (JP) .............................. 2003-395615

(51) Int. Cl.
*H01L 31/062* (2006.01)
*H01L 31/113* (2006.01)
*H01L 31/072* (2006.01)
*H01L 31/109* (2006.01)
*H01L 31/0392* (2006.01)

(52) U.S. Cl. ............... 257/292; 257/184; 257/186; 257/291; 257/293

(58) Field of Classification Search ........ 257/184–186, 257/290–293
See application file for complete search history.

(56) References Cited

U.S. PATENT DOCUMENTS

| 5,285,091 A * | 2/1994 | Hamasaki ............... 257/292 |
| 5,719,421 A * | 2/1998 | Hutter et al. ............ 257/335 |
| 5,808,333 A * | 9/1998 | Maruyama et al. ...... 257/290 |
| 6,051,857 A * | 4/2000 | Miida ...................... 257/292 |
| 6,448,596 B1 * | 9/2002 | Kawajiri et al. ........ 257/292 |
| 6,489,658 B1 * | 12/2002 | Richter et al. .......... 257/401 |
| 6,914,228 B1 * | 7/2005 | Yato ........................ 250/208.1 |
| 6,946,638 B1 * | 9/2005 | Kuwazawa et al. ...... 250/208.1 |
| 2002/0024071 A1 * | 2/2002 | Kawajiri et al. ........ 257/292 |
| 2005/0185072 A1 * | 8/2005 | Watanabe ................ 348/294 |

FOREIGN PATENT DOCUMENTS

| JP | 2513981 | 4/1996 |
| JP | 09-307091 | 11/1997 |
| JP | 10-065138 | 3/1998 |
| JP | 2001-177085 | 6/2001 |
| JP | 2002-164527 | 6/2002 |

OTHER PUBLICATIONS

Communication from Japanese Patent Office re: related application.

* cited by examiner

*Primary Examiner*—Jerome Jackson
*Assistant Examiner*—Jesse A. Fenty
(74) *Attorney, Agent, or Firm*—Harness, Dickey & Pierce, P.L.C.

(57) ABSTRACT

A solid-state imaging device is provided which has preferable linearity of signal outputs according to light intensities and does not cause dark defects even at a low light intensity. The solid-state imaging device comprises: a ring gate having a non-uniform width; a source region formed inside the ring gate; a drain region formed surrounding a circumference of the ring gate; and a carrier pocket formed under the ring gate, wherein a region where (X divided by Y) is the smallest substantially coincides with a region where Z is the shortest; X is a pocket-to-source distance; Y is a pocket-to-drain distance; and Z is a source-to-drain distance.

6 Claims, 5 Drawing Sheets

SOLID-STATE IMAGING DEVICE

RELATED APPLICATIONS

This application claims priority to Japanese Patent Application No. 2003-395615 filed Nov. 26, 2003 which is hereby expressly incorporated by reference herein in its entirety.

BACKGROUND

1. Field of the Invention

The present invention relates to a solid-state imaging device providing high image quality and low power consumption and, especially, a solid-state imaging device, having a ring-shaped gate, which can obtain signal outputs by modulating threshold voltages (Vth) in accordance with subject light.

2. Related Art

As solid-state imaging devices to be built in cellular phones, etc., there are two types of image sensors: charge-coupled device (CCD) image sensors; and CMOS image sensors. CCD image sensors are superior in image quality, while CMOS image sensors consume lower power and process cost. In recent years, proposals have been made for MOS imaging devices employing threshold voltage modulation which provides both high image quality and low power consumption. A type of MOS imaging device providing threshold voltage modulation is disclosed in, for example, Japanese Patent Serial No. 2513981.

The image sensor disclosed in Japanese Patent Serial No. 2513981 obtains image outputs by arranging sensor cells, which correspond to unit pixels, in a matrix and repeating a three-state cycle of initialization, storage and read-out. Each unit pixel of the image sensor has a photodiode for storage, a modulation transistor for read-out, and an overflow drain gate for initialization. The gate of the modulation transistor is ring-shaped.

A light-generated charge generated by incident light entering the photodiode is transferred to a P-well region provided under the ring gate and stored in a carrier pocket formed in the region. The light-generated charge stored in the carrier pocket changes the threshold voltage (Vth) of the modulation transistor, which makes it possible to obtain a pixel signal corresponding to the incident light from a terminal (source contact) coupled to the source region of the modulation transistor.

FIG. 8 is a schematic top-view drawing of a modulation transistor unit of an image sensor.

The image sensor shown in FIG. 8 has a photodiode 110 and a modulation transistor 101 adjacent to each other for each unit pixel on a board. A gate 102 of the modulation transistor 101 is formed in a ring. In an opening at the center of the ring gate 102, a source region 104 is formed. A gate contact is formed, though not illustrated, on part of the surface of the ring gate 102. Provided around the ring gate 102 is a drain region 106. A light-generated charge (carrier) generated by incident light entering the photodiode 110 is stored in a carrier pocket 108, which is a ring-shaped narrow band formed in a P-well region provided under the ring gate 102. When the stored charge changes the threshold voltage (Vth) of the modulation transistor 101, a pixel signal corresponding to the incident light can be output from a source contact 105 coupled to the source region 104 of the modulation transistor 101. By applying bias voltages of, for example, 5V and 0V to a drain contact 107 and the source contact 105, respectively, electric current flows between the drain and the source in accordance with the intensity of incident light entering the photodiode 110, and a signal output is output from the source contact 105.

If a locally low-potential region 109 is formed at part of the carrier pocket 108 under the ring gate 102 due to, for example, an uneven impurity concentration within the well, carriers (holes) are not stored uniformly in the carrier pocket 108 which is ring-shaped, but stored first in the locally low-potential region 109 when light enters the photodiode 110. If there is no locally low-potential region 109, an electric current-flow path (hereinafter referred to as "current path") from all directions of the region (drain region 106) outside the circumference of the ring gate 102 toward the source region 104 is formed, and electric current flows uniformly on this path. In the latter case, a signal starts being output linearly from the time the amount of stored electric charges is still small (see line g in FIG. 9). Whereas, if there is the locally low-potential region 109, electric current does not flow from all directions of the region (drain region 106) outside the circumference of the ring gate 102 toward the source region 104, but starts flowing into the locally low-potential region 109. Therefore, low light intensity results in the slow rising of signal outputs, worsening linearity (see line h in FIG. 9), and thereby causing dark defects.

Similar problems are disclosed in, for example, FIG. 15 and FIG. 17 of Japanese Unexamined Patent Publication No. 10-65138. However, in Japanese Unexamined Patent Publication No. 10-65138, a countermeasure is taken by forming a current path in a specific region in accordance with impurity distribution instead of a configuration forming a gate in a ring shape. Also, examples of forming a ring-shaped gate are shown in Japanese Unexamined Patent Publication No. 2002-164527, as well as Japanese Patent Serial No. 2513981 (discussed above).

As described above, local non-uniformity of potential in the carrier pocket on the ring gate has been causing a problem of dark defects when the amount of stored electric charges is small, that is, when the light intensity is low.

Accordingly, the present invention has been developed in view of the above problem and aims to provide a solid-state imaging device which has preferable linearity of signal outputs according to light intensities and does not cause dark defects even at a low light intensity.

SUMMARY

The above and other objects are provided by a solid-state imaging device comprising: a ring gate having a non-uniform width; a source region formed inside the ring gate; a drain region formed surrounding a circumference of the ring gate; and a carrier pocket formed under the ring gate, wherein a region where (X divided by Y) is the smallest substantially coincides with a region where Z is the shortest; X is a pocket-to-source distance; Y is a pocket-to-drain distance; and Z is a source-to-drain distance.

According to the present invention, a region where X/Y is the smallest is a region where a voltage potential is the lowest in the intermediate points of the pocket width. Therefore, the region where X/Y is the smallest is a region where carriers (holes) are stored most easily.

Further, a region where Z is the shortest, that is, the gate length L of the ring gate is the shortest, is a region where transistor capacity is the highest, that is, an electric current flows most easily. Therefore, coincidence between a region where carriers (holes) are stored most easily and a region having the highest transistor capacity is found. In such a region, it is considered that carriers effectively contribute to the modulation of a drain-to-source current because an electric current flows most easily (performance is the highest) and the largest amount of carriers is stored. In other words, the present invention, which provides a configuration having an electric current-flowing path (current path) basically in all directions on the entire circumference of the ring gate, achieves a setting which makes the amount of electric currents flowing partially larger by changing the shape of the ring gate to form a region where potential is lowered.

In the present invention, it is preferable that the ring gate has an oval contour and that the source region is formed in a round shape at the center of the ring gate.

With this configuration, supposing, for example, that the carrier pocket is provided in a ring shape with a roughly constant width so that the carrier pocket lies almost along the circumference of the ring gate by forming the ring gate in an oval shape and the source region in a round shape at the center of the ring gate, it becomes possible to achieve coincidence, on the ring gate, between a region where potential is the lowest, that is, carriers (holes) are stored most easily, and a region where an electric current flows most easily (performance is the highest).

Further, in the present invention, it is preferable that the ring gate has a round contour and that the source region is formed in an oval shape at the center of the ring gate.

With this configuration, supposing, for example, that the carrier pocket is provided in a ring shape with a roughly constant width under the ring gate, and near the circumference in the major-axis direction of the oval source region and, further, near the circumference of the ring gate in the minor-axis direction of the oval source region by forming the ring gate in a round shape and the source region in an oval shape at the center of the ring gate, it becomes possible to achieve coincidence, on the ring gate, between a region where potential is the lowest, that is, carriers (holes) are stored most easily, and a region where an electric current flows most easily (performance is the highest).

DETAILED DESCRIPTION

The present invention will now be described referring to the accompanying drawings.

Figure 5:
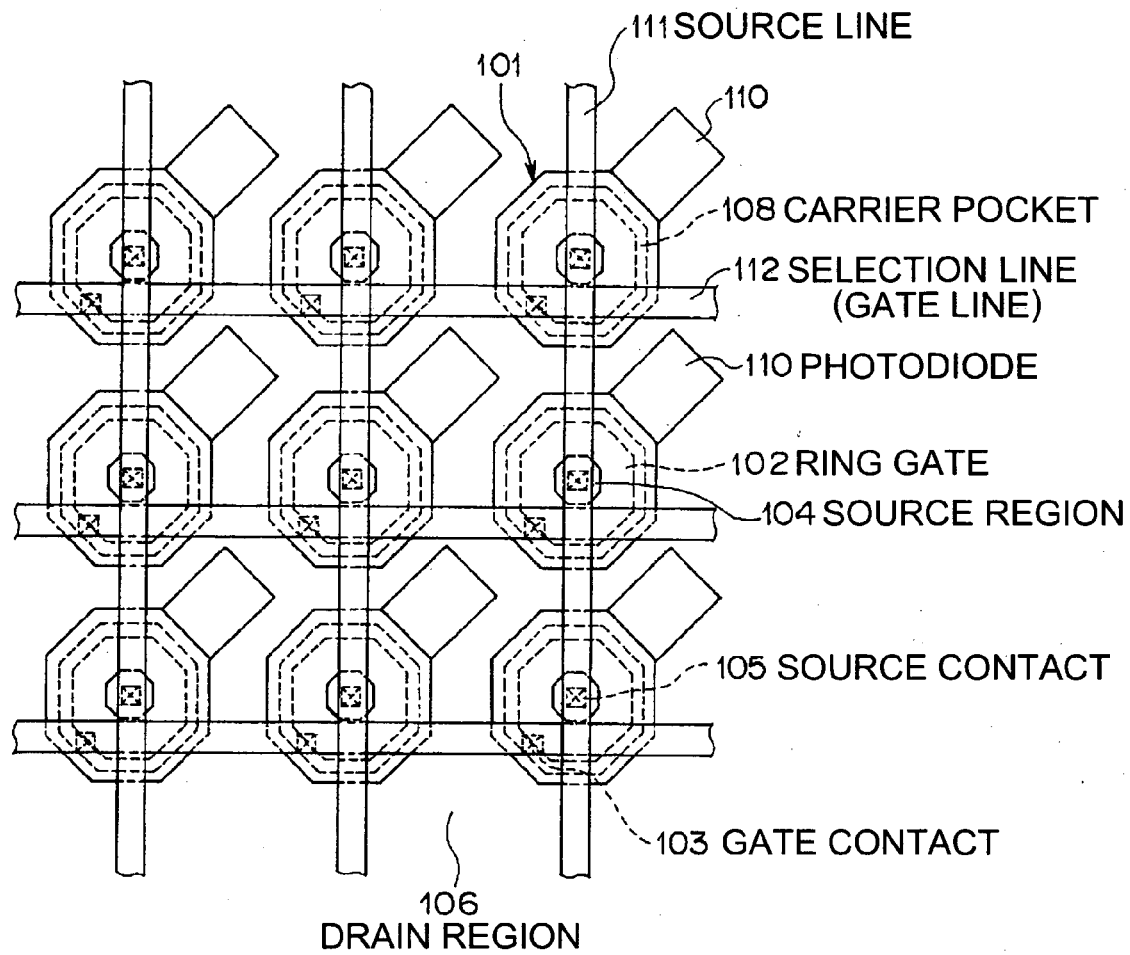
FIG. 5 is a view showing the layout of sensor cells in a solid-state imaging device.

As embodiments of the present invention, a MOS solid-state imaging device employing threshold voltage modulation is explained. As shown in FIG. 5, the solid-state imaging device has a configuration having sensor cells, which make pixels on a board, arranged in a matrix of rows (horizontal direction) and columns (vertical direction). FIG. 5 shows an example of the ring gate 102 having an octagonal contour (perimeter shape). For each unit pixel on the board, a solid-state imaging device has a photodiode 110 generating light-generated charges (carriers) by using incident light and the modulation transistor 101 outputting pixel signals based on the light-generated charges (carriers) corresponding to the incident light. By the modulation transistor 101, which is provided adjacent to the photodiode 110, light-generated charges generated in the photodiode 110 are transferred to a P-well region 113 (see FIG. 6) provided under the ring gate 102 and stored in the carrier pocket 108, which is a ring-shaped narrow band formed in the region. Further, the light-generated charges stored in the carrier pocket change the threshold voltage Vth of the transistor, and then a pixel signal corresponding to the incident light is output from the source contact 105, which is coupled to the source region 104, via a source line 111. The carrier pocket 108 is provided in a narrow band under the ring gate 102 (the area enclosed by the two dotted lines). A gate line, that is, a selection line 112 is provided for selecting a line (a horizontal row) where pixel signals are to be read from the source region 104 by supplying a bias voltage to the gate 102 via a gate contact 103. In addition, the drain region 106 forms the drain of the modulation transistor 101, and also has a function of isolating sensor cells.

Figure 6:
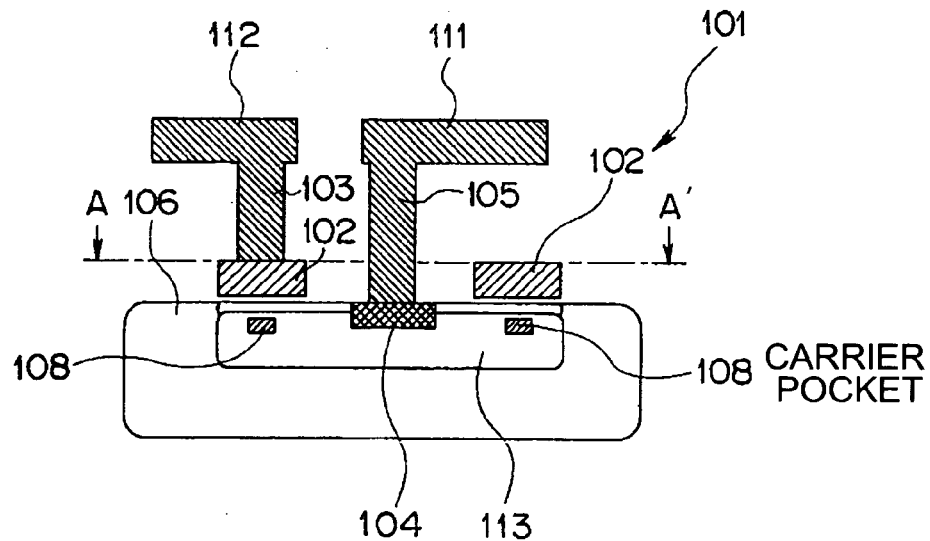
FIG. 6 is a vertical sectional view showing a modulation transistor unit in each sensor cell in FIG. 5.

FIG. 6 is a vertical cross-sectional drawing showing the modulation transistor 101 in each sensor cell in FIG. 5. Numbers assigned to each part correspond to those in FIG. 5. The carrier pocket 108 is provided with a narrow width in the P-well region 113 under the gate 102, and the drain region 106 is formed surrounding a channel under the gate 102, and the P-well region 113.

Figure 7A:
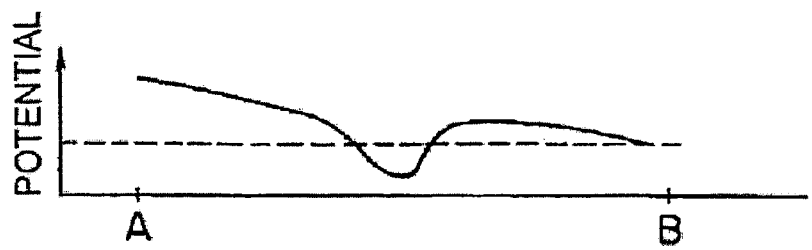
FIG. 7A is a graph showing potential among the drain, carrier pocket and source (FIG. 7B) of the modulation transistor in FIG. 5 and FIG. 6.
Figure 7B:
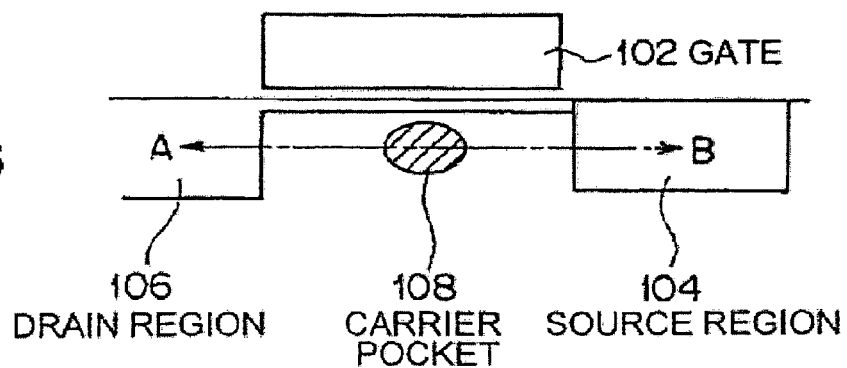
Figure 8:
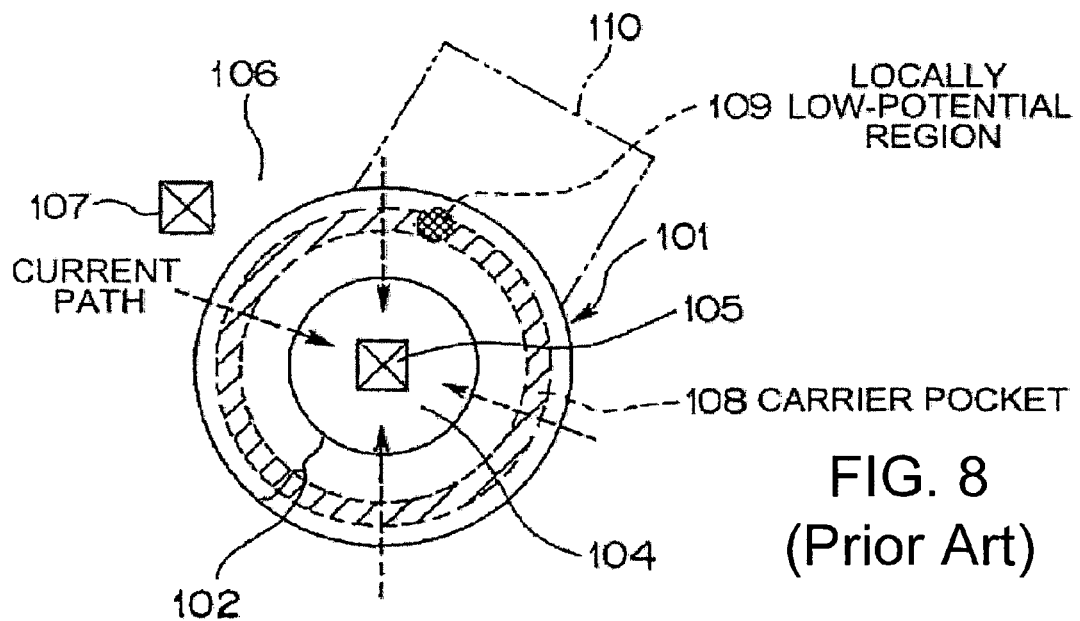
FIG. 8 is a schematic top-view drawing of a modulation transistor unit of an image sensor.

FIG. 7A is a graph showing potential among the drain, the carrier pocket and the source of the modulation transistor in FIG. 5 and FIG. 6. FIG. 7B is a schematic cross-sectional drawing of the modulation transistor corresponding to the horizontal axis in FIG. 7A. Potential becomes the lowest at the center of the carrier pocket 108.

First Embodiment

Figure 1:
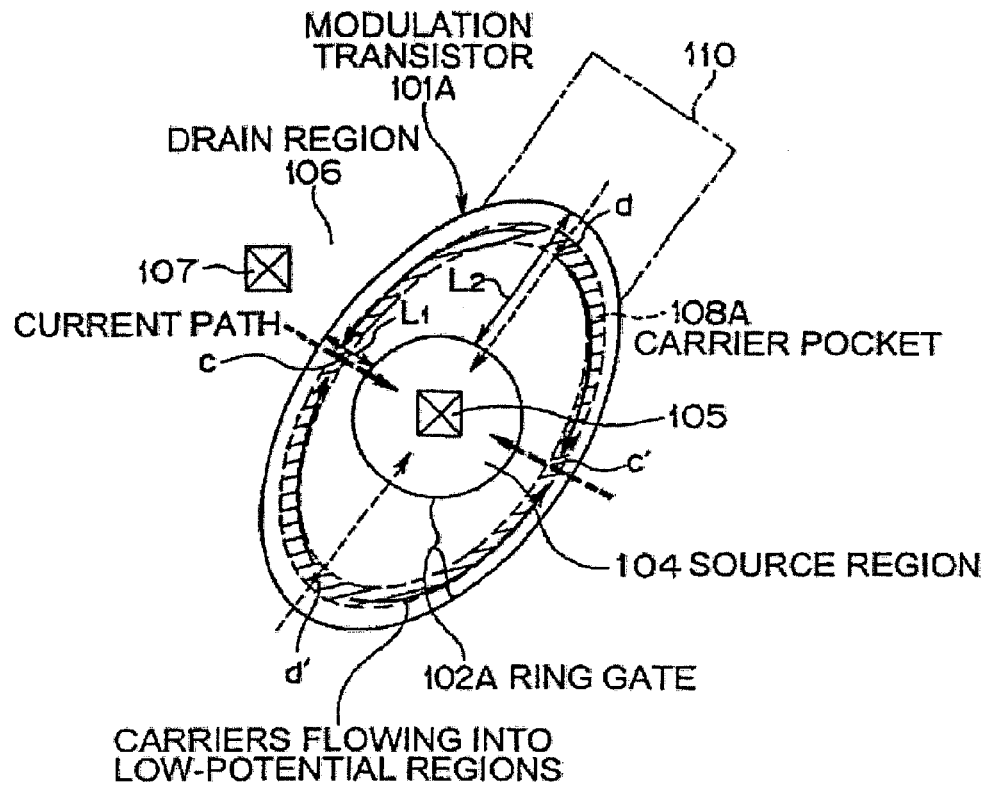
FIG. 1 is a schematic top-view drawing of a modulation transistor of a censor cell in a solid-state imaging device of a first embodiment of the present invention.
Figure 2:
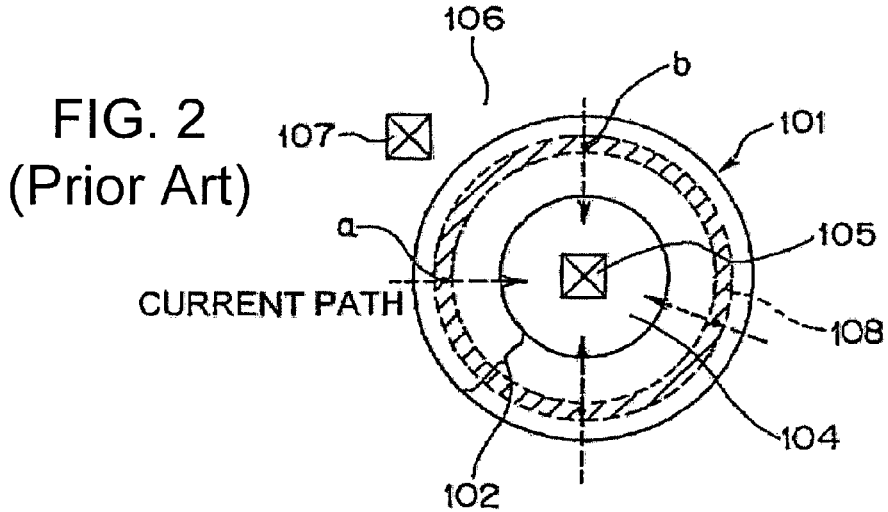
FIG. 2 is a schematic view of a conventional modulation transistor.
Figure 3:
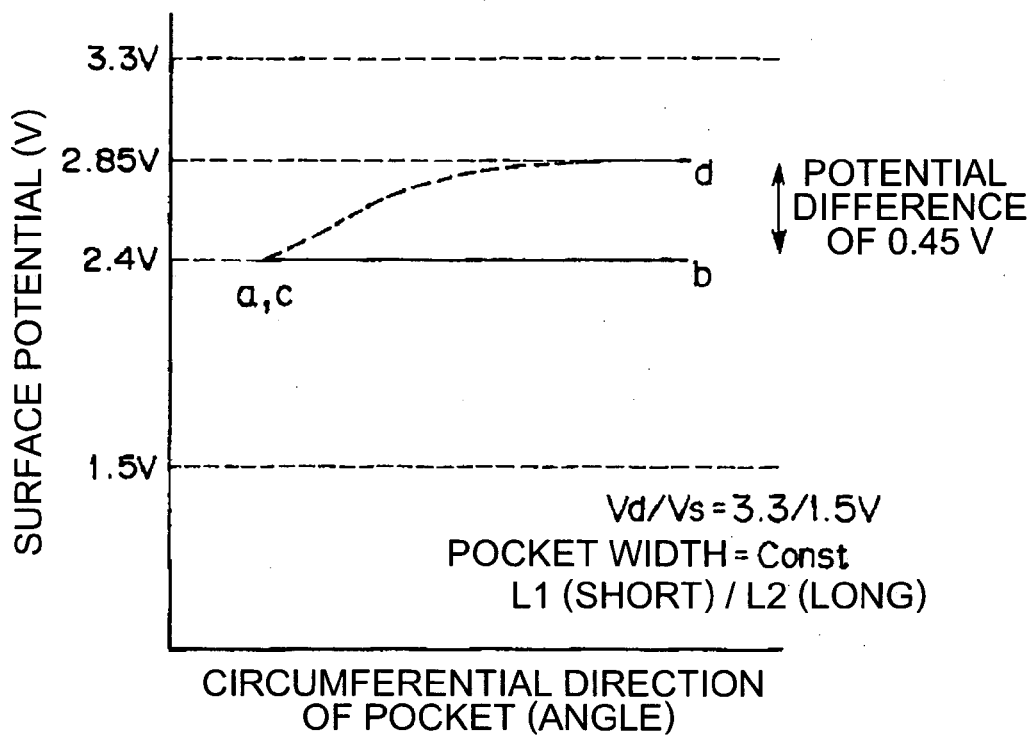
FIG. 3 is a graph for comparing surface potential between a modulation transistor according to the present invention and a conventional modulation transistor.

FIG. 1 is a schematic top-view drawing of a modulation transistor in a solid-state imaging device of a first embodiment of the present invention. FIG. 2 is a schematic view of a conventional modulation transistor (along line A–A' shown in FIG. 6, the photodiode is not illustrated). FIG. 3 is a graph for comparing surface potential between the modulation transistor according to the present invention and the conventional modulation transistor. For parts that are the same as those shown in FIG. 5, the same numbers are assigned for explanation. In FIG. 1, a modulation transistor 101A according to the first embodiment of the present invention configures a sensor cell together with a photodiode (shown by a two-dot chain line 110) which receives incident light. A ring gate 102A has an oval contour (perimeter shape). The source region 104 is formed in a round shape at the center of the ring gate 102A. A carrier pocket 108A is formed in a ring-shaped narrow band with a roughly constant width under the ring gate 102A and almost along the circumference of the ring gate 102A. The source contact 105 is located at the center of the round source region 104. The drain region 106 is provided outside the circumference of the ring gate 102A. In part of the drain region 106, the drain contact 107 is located. In addition, the source region 104, which is formed in a round shape at the center of the ring gate 102A, is described assuming that the part corresponding to the entire area inside the round shape is the source region.

In this configuration, when the photodiode 110 starts receiving incident light, the light-generated charges generated in the photodiode 110 are stored in the carrier pocket 108A. The stored charges (holes) are stored first in regions whose potential is the lowest.

In the carrier pocket 108A provided in a ring-shaped narrow band, intermediate points c and c' of the carrier pocket width in the minor-axis direction of the oval shape are located in the approximate middle of the gate length (channel length) L1 in the minor-axis direction of the ring gate 102A. Potential at these intermediate points is approximately half the drain-to-source voltage. Further, in the carrier pocket 108A, intermediate points d and d' of the carrier pocket width in the major-axis direction of the oval shape are located at approximately three quarters of the gate length (channel length) L2 (with reference to the source circumference) in the major-axis direction of the ring gate 102A. Potential at these intermediate points is approximately three quarters of the drain-to-source voltage. Potential is the lowest at c and c', and the highest at d and d'.

Assuming that drain voltage Vd=3.3 V, source voltage Vs=1.5 V, pocket width=constant (Const), and L1/L2=½, the potential at point c (and point c') is given by: (Vd+Vs)/2=2.4 V, and the potential at point d (and point d') is given by: 3 (Vd+Vs)/4=2.85 V, as shown by the dotted line in FIG. 3.

Therefore, the configuration having the oval ring gate 102A, with the round source region 104 in its center, and a carrier pocket formed as illustrated makes a potential difference of 0.45 V between point c and point d in the carrier pocket 108A as shown in FIG. 3. At the same time, the variation of surface potential on the carrier pocket sandwiched between point c and point d makes a curve which continuously shifts from 2.4 V at point c to 2.85 V at point d, as shown by the dotted line in FIG. 3.

During modulation, potential of the carrier pocket in the major-axis direction (near points d and d') becomes higher due to the splitting ratio of the drain-to-source voltage, which lets the light-generated charges (carriers) stored in the carrier pocket 108A flow into and be stored in the carrier pocket in the minor-axis direction (near points c and c') as shown by the solid-line arrow. Further, the region having the largest capacity for making an electric current flow from the drain region 106 into a source region 104A is the channel in the minor-axis direction (near points c and c'), as described above. Therefore, the first embodiment of FIG. 1 has a layout achieving coincidence between a region where carriers are stored and a region where electric current flows most easily. This means that carriers effectively contribute to modulation even in a dark environment. As a result, the linearity of light intensities and signal outputs can be improved.

On the other hand, in the conventional modulation transistor 101 shown in FIG. 2, the ring gate 102 has a round contour (perimeter shape) and the source region 104 is also formed in a round shape at the center of the ring gate 102. Further, the carrier pocket 108 is formed under the ring gate 102 in a ring-shaped narrow band with a roughly constant width substantially along the circumference of the ring gate 102. The source contact 105 is located at the center of the round source region 104. The drain region 106 is provided outside the circumference of the ring gate 102. The drain contact 107 is located in part of the drain region 106.

Figure 9:
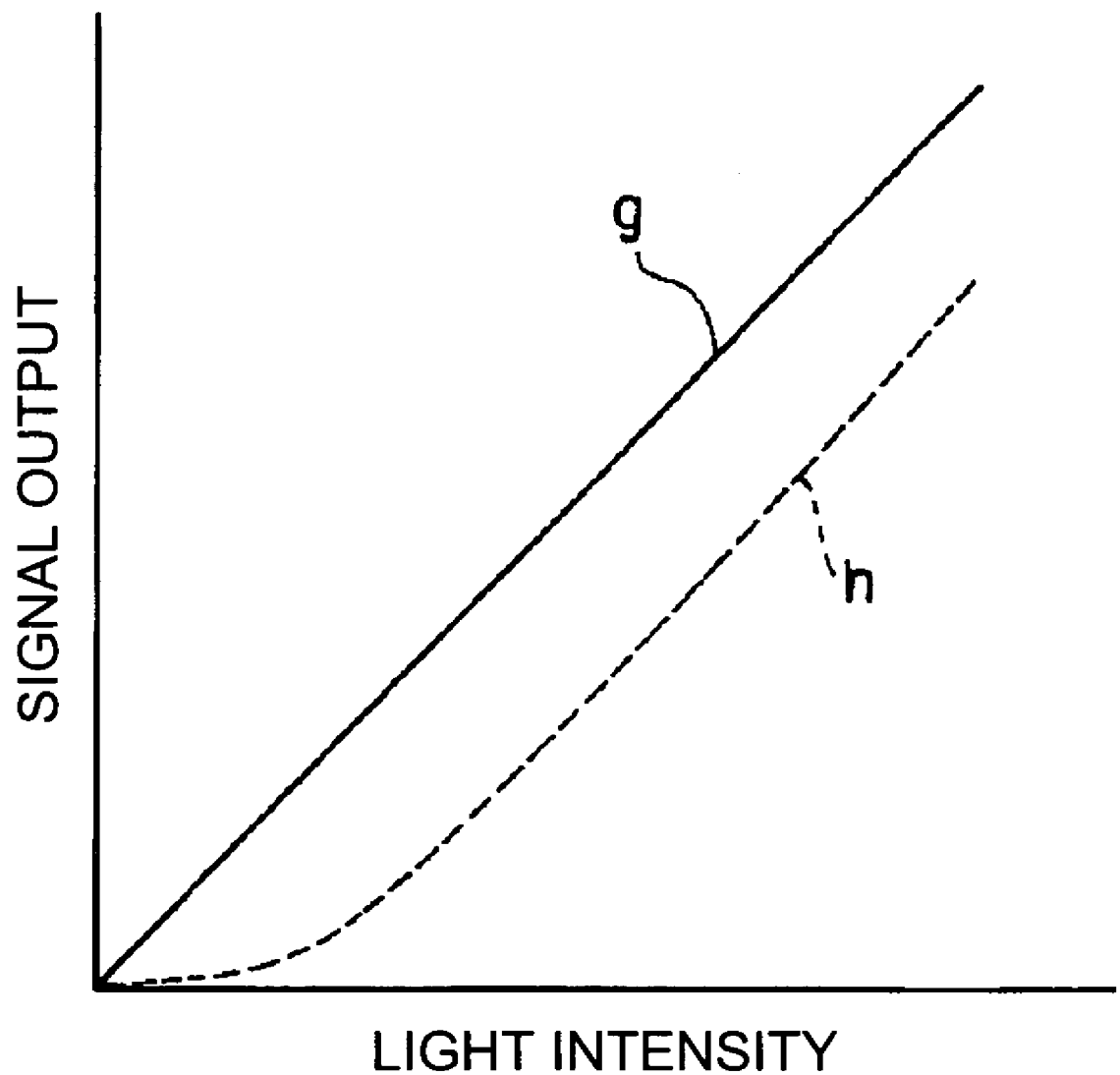
FIG. 9 is a graph showing the relation between light intensities and signal outputs in a sensor cell.

In the carrier pocket 108 provided in a ring-shaped narrow band, potential at two intermediate points a and b of the carrier pocket width located on the circumference at a 90-degree angle relative to each other, and the potential on the part of the carrier pocket between the two points a and b is all the same, which is given by (Vd+Vs)/2=2.4 V, as shown by the solid line in FIG. 3. This means that there is no low-potential region. Therefore the flow of electric current is not so smooth especially in a dark environment and, as explained in FIG. 9, the linearity of light intensities and signal outputs becomes poor (see line h in FIG. 9).

As described above, in the conventional configuration, an electric current flows uniformly from all directions as shown in FIG. 2. Whereas in the present embodiment of the present invention having non-uniform and partially wider ring gate width, the amount of electric currents becomes larger where the current path is shorter (near points c and c'), and smaller where the current path is longer (near points d and d'). Therefore, signal outputs occur mainly in a region where a large amount of electric currents flows. Thus, even if threshold voltage Vth varies because of a potential dip (a decrease in potential), etc., in an area where the current path is short, its effect is small enough to control the variation among the sensor cells in a probabilistic manner.

In addition, in the modulation transistor 101 in FIG. 2, the carrier pocket 108 is provided under the ring gate 102 in a ring-shaped narrow band with a roughly constant width substantially along the circumference of the ring gate 102. As another example of conventional configurations (not illustrated), by forming the carrier pocket 108 under the entire area of the ring gate 102, that is, with the same width (or the same gate length) as that of the ring gate 102, when the intermediate point is defined as the distance reference in measuring the pocket-to-source distance or the pocket-to-drain distance (the pocket here means the carrier pocket), the {pocket-to-source distance} to {pocket-to-drain distance} ratio is set to 1:1 uniformly on the entire circumference. Therefore, it can be said that no area with the lowest potential is formed.

Second Embodiment

Figure 4:
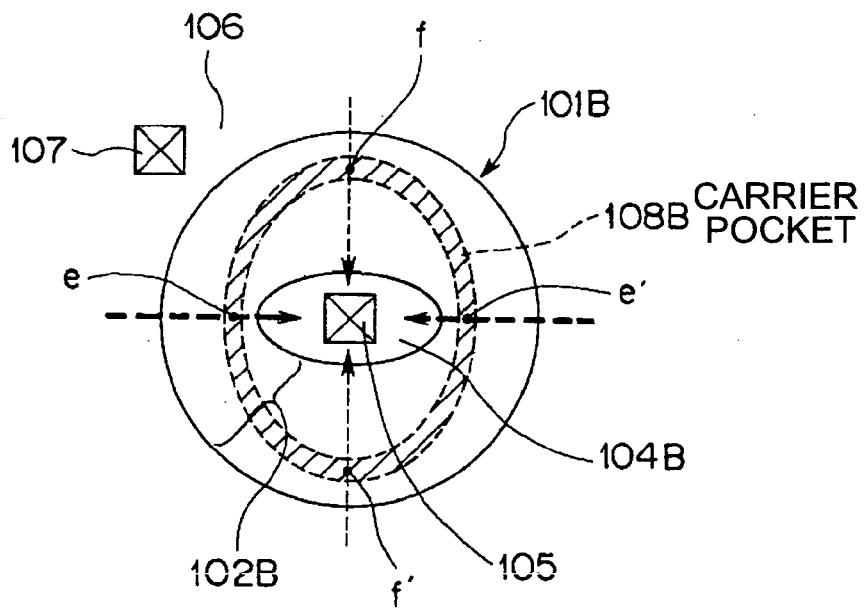
FIG. 4 is a schematic top-view drawing of a modulation transistor of a censor cell in a solid-state imaging device of a second embodiment of the present invention.

FIG. 4 is a schematic top-view drawing of a modulation transistor in a solid-state imaging device of a second embodiment of the present invention. In the actual configuration of the sensor cells, there is a photodiode adjacent to the modulation transistor, which is omitted here.

In FIG. 4, a modulation transistor 101B according to the second embodiment of the present invention configures a sensor cell together with a photodiode (not illustrated) which receives incident light. A ring gate 102B has a round contour (perimeter shape). A source region 104B is formed in an oval shape at the center of the ring gate 102B. A carrier pocket 108B is provided in an approximate oval shape with a roughly constant width under the ring gate 102B and near the circumference in the major-axis direction of the oval source region 104B and, further, near the circumference of the ring gate 102B in the minor-axis direction of the oval source region 104B. The source contact 105 is located at the center of the oval source region 104B. The drain region 106 is provided outside the circumference of the ring gate 102B. The drain contact 107 is located in part of the drain region 106. In addition, the source region 104B, which is formed in an oval shape at the center of the ring gate 102B, is described assuming that the part corresponding to the entire area inside the oval shape is the source region.

During modulation with this configuration, potential of the carrier pocket in the minor-axis direction of the oval source region 104B (near points f and f') becomes higher due to the splitting ratio of the drain-to-source voltage, which lets the light-generated charges (carriers) stored in the carrier pocket 108B flow into and be stored in the carrier pocket in the major-axis direction of the oval source region 104B (near points e and e'). Further, a region having the largest capacity for making electric current flow from the drain region 106 into the source region 104B is the channel in the major-axis direction of the oval source region 104B (near points e and e'), where the drain-to-source distance is the shortest. Therefore, the second embodiment of FIG. 4 has a layout achieving coincidence between a region where carriers are stored and a region where electric current flows most easily. This means that carriers effectively contribute to modulation even in a dark environment. As a result, the linearity of light intensities and signal outputs can be improved.

Moreover, although the above-described embodiments describe the shape of the ring gates and the oval or round source regions in the ring gates, the present invention allows any ring gate shape or source region shape if it satisfies the above conditions. Therefore, the ring gate or the source region can be formed in any polygonal shape approximating an oval or round shape such as an octagonal shape.

Field of Industrial Application

The present invention, which provides a configuration having an electric current-flowing path (current path) basically in all directions on the entire circumference of the ring gate, achieves a setting which makes the amount of electric currents flowing partially larger by changing the shape of the ring gate to form a region where the potential is lowered. Also, the present invention is especially effective when applied to a MOS solid-state imaging device employing voltage modulation.

What is claimed is:

1. A solid-state imaging device comprising:
   a ring gate having a non-uniform width;
   a source region inside the ring gate;
   a drain region surrounding a circumference of the ring gate; and
   a carrier pocket under the ring gate,
   wherein a region where (X/Y) is the smallest substantially coincides with a region where Z is the shortest;
   X is a pocket-to-source distance;
   Y is a pocket-to-drain distance; and
   Z is a source-to-drain distance.

2. The solid-state imaging device according to claim 1, wherein the ring gate has an oval contour and the source region has a round shape located at a center of the ring gate.

3. The solid-state imaging device according to claim 1, wherein the ring gate has a round contour and the source region has an oval shape located at a center of the ring gate.

4. A solid-state imaging device comprising:
   a ring gate having an oval contour;
   a source region having a round shape located at a center of the ring gate so that the ring gate has a non-uniform width;
   a drain region surrounding a circumference of the ring gate; and
   a carrier pocket having an oval shape under the ring gate,
   wherein a region where (X/Y) is the smallest substantially coincides with a region where Z is the shortest;
   X is a pocket-to-source distance;
   Y is a pocket-to-drain distance; and
   Z is a source-to-drain distance.

5. A solid-state imaging device comprising:
   a ring gate having a round contour;
   a source region having an oval shape located at a center of the ring gate so that the ring gate has a non-uniform width;
   a drain region surrounding a circumference of the ring gate; and
   a carrier pocket having an oval shape under the ring gate.

6. The solid-state imaging device of claim 5 wherein:
   a region where (X/Y) is the smallest substantially coincides with a region where Z is the shortest;
   X is a pocket-to-source distance;
   Y is a pocket-to-drain distance; and
   Z is a source-to-drain distance.

* * * * *